(12) United States Patent
Rogers

(10) Patent No.: US 7,407,083 B2
(45) Date of Patent: Aug. 5, 2008

(54) BONDED SILICON, COMPONENTS AND A METHOD OF FABRICATING THE SAME

(75) Inventor: C. James Rogers, Racine, WI (US)

(73) Assignee: Thermal Corp., Wilmington, DE (US)

( * ) Notice: Subject to any disclaimer, the term of this patent is extended or adjusted under 35 U.S.C. 154(b) by 289 days.

(21) Appl. No.: 10/921,527

(22) Filed: Aug. 19, 2004

(65) Prior Publication Data

US 2006/0037994 A1    Feb. 23, 2006

(51) Int. Cl.
*B23K 20/00*    (2006.01)
*B23K 31/02*    (2006.01)

(52) U.S. Cl. .................... 228/121; 228/194; 228/245

(58) Field of Classification Search ............... 228/121, 228/122.1, 182, 183, 262.1
See application file for complete search history.

(56) References Cited

U.S. PATENT DOCUMENTS

| | | | |
|---|---|---|---|
| 3,316,628 A | 5/1967 | Lang | |
| 4,032,350 A * | 6/1977 | Greenstein | 106/1.13 |
| 4,574,470 A * | 3/1986 | Burt | 438/612 |
| 4,622,433 A * | 11/1986 | Frampton | 174/539 |
| 4,656,499 A * | 4/1987 | Butt | 257/677 |
| 4,701,424 A * | 10/1987 | Mikkor | 438/455 |
| 4,729,060 A | 3/1988 | Yamamoto et al. | |
| 4,783,721 A | 11/1988 | Yamamoto et al. | |
| 5,037,778 A | 8/1991 | Stark et al. | |
| 5,097,387 A | 3/1992 | Griffith | |
| 5,126,919 A | 6/1992 | Yamamoto et al. | |
| 5,132,779 A * | 7/1992 | Osada et al. | 257/729 |
| 5,358,032 A | 10/1994 | Arai et al. | |
| 5,585,827 A * | 12/1996 | Murakami | 347/64 |
| 5,731,635 A | 3/1998 | Bareither et al. | |
| 5,755,374 A * | 5/1998 | Prigmore | 228/183 |
| 6,046,907 A | 4/2000 | Yamaguchi | |
| 6,091,603 A | 7/2000 | Daves et al. | |
| 6,232,150 B1 | 5/2001 | Lin et al. | |
| 6,255,002 B1 | 7/2001 | Olofsson | |
| 6,314,639 B1 * | 11/2001 | Corisis | 29/827 |
| 6,799,628 B1 * | 10/2004 | Masseth et al. | 165/80.4 |
| 6,869,818 B2 * | 3/2005 | Harris et al. | 438/50 |
| 6,944,931 B2 * | 9/2005 | Shcheglov et al. | 29/595 |
| 7,150,797 B2 * | 12/2006 | Tsushima et al. | 148/24 |
| 2004/0251008 A1 * | 12/2004 | O'Neill et al. | 165/166 |
| 2006/0071326 A1 * | 4/2006 | Chrysler et al. | 257/714 |

* cited by examiner

*Primary Examiner*—Kiley Stoner
(74) *Attorney, Agent, or Firm*—Michael Best & Friedrich LLP

(57) ABSTRACT

A heat pipe housing assembly (22) includes a pair of silicon housing pieces (24, 26) and a bond joint (42) between the housings (24, 26), with the bond joint (42) preferably including a eutectic layer (43).

29 Claims, 2 Drawing Sheets

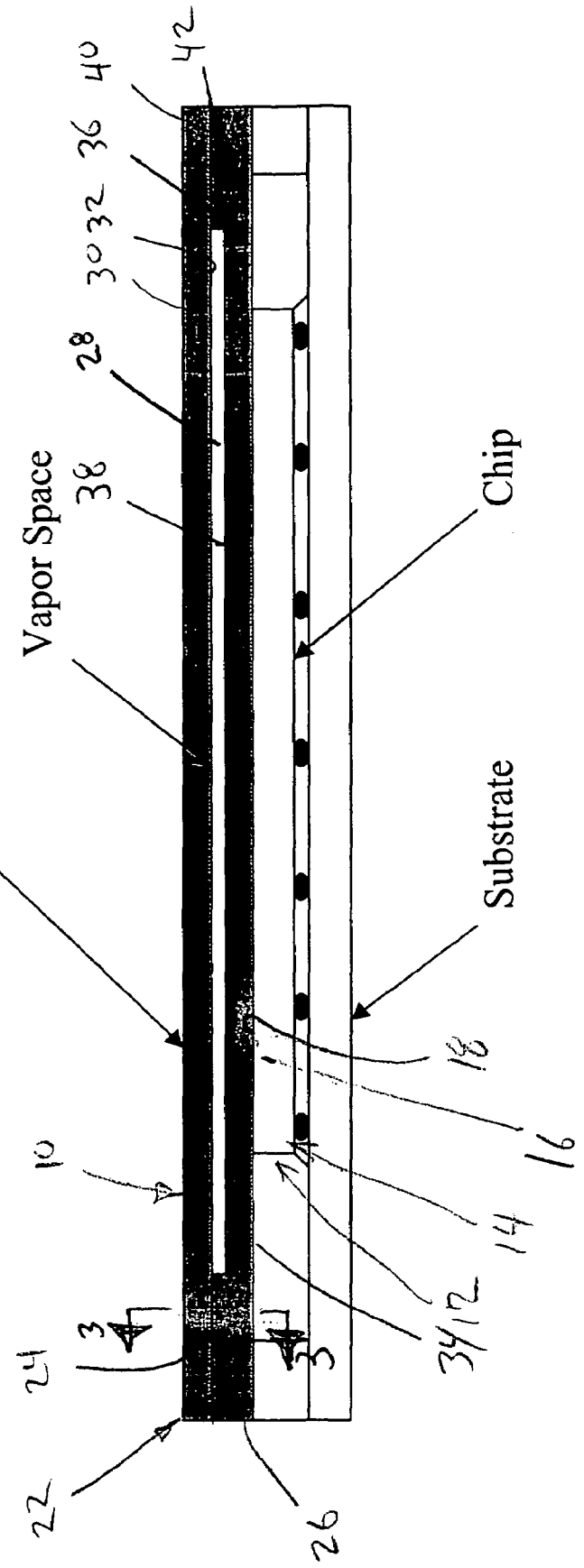

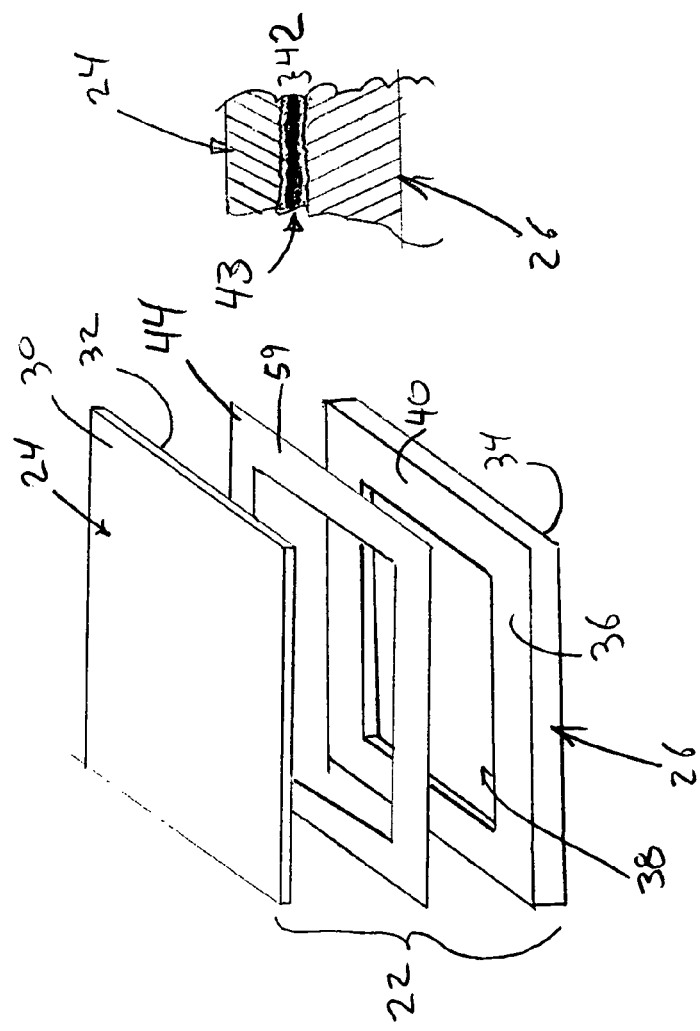
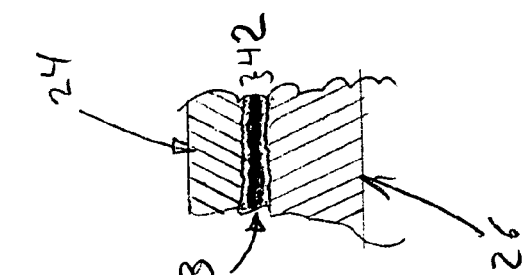
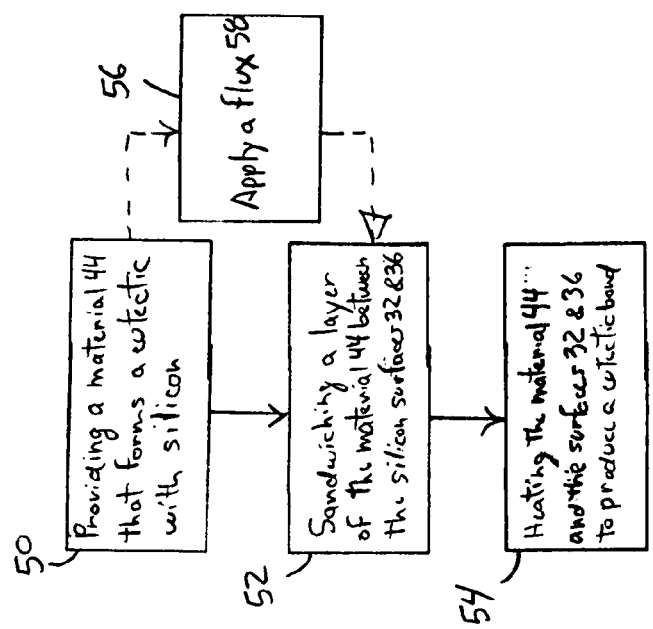

US 7,407,083 B2

BONDED SILICON, COMPONENTS AND A METHOD OF FABRICATING THE SAME

FIELD OF THE INVENTION

This invention relates to heat pipes and methods for bonding silicon components, and in more particular applications, to a heat pipe having a silicon housing assembly and a method of fabricating such assemblies.

BACKGROUND OF THE INVENTION

Heat pipes are well known, and are often utilized for the cooling of electronic components, including integrated circuit chips, CPUs, and the like. Conventionally, heat pipes utilize a heat conductive housing made of metal which is attached directly to the electronic component or to a casing or lid of the electronic component to improve the heat rejection from the electronic component to this heat pipe. One problem associated with such a heat pipe application is maintaining a suitable attachment between the heat pipe housing and the electronic component, (such as a silicon chip) or the electronic component, casing or lid, which typically is made of silicon, due to the differences of thermal expansion between the silicon chip or casing/lid of the electronic component and the metal of the heat pipe.

SUMMARY OF THE INVENTION

In accordance with one aspect of the invention, a method is provided for fabricating a heat pipe housing made of silicon. The method includes the steps of providing a material that forms a eutectic with silicon at a temperature below the melting point of silicon, sandwiching a layer of the material between two silicon surfaces of two pieces of a heat pipe housing, and heating the sandwiched layer of the material and the two silicon surfaces to a temperature between the eutectic temperature and the melting point of silicon, and maintaining the sandwiched layer of material and the two silicon surfaces between the eutectic temperature and the melting point of silicon until the material and the silicon diffuse into each other to produce a bond joint between the two pieces.

In one aspect, the bond joint includes a eutectic of the material and the silicon.

According to one aspect, the heating step includes heating the sandwiched layer of the material and the silicon surfaces in dry nitrogen at one atmosphere to a temperature between the eutectic temperature and the melting point of silicon, and maintaining the sandwiched layer of material and the two surfaces between the eutectic temperature and the melting point of silicon in dry nitrogen at one atmosphere until the material and the silicon diffuse into each other to produce an alloy containing a eutectic of the material and the silicon upon solidification.

In one form, the material comprises aluminum.

In one form, the material comprises gold.

According to one aspect, the sandwiching step comprises sandwiching a foil of the material between the two silicon surfaces.

In one aspect, the method further comprises the step of applying a flux between the layer and each of the two silicon surfaces prior to the sandwiching step. In one form, the flux comprises a potassium fluoro aluminate flux.

According to one aspect of the invention, a heat pipe housing construction is provided and includes a first housing piece made of silicon, a second housing piece made of silicon, and a silicon eutectic layer at a bond joint between the first and second housings.

In one form, the bond joint surrounds a working fluid chamber defined between the two housings.

In one form, the bond joint includes an aluminum-silicon eutectic.

In one aspect, the bond joint includes a gold-silicon eutectic.

In accordance with one aspect of the invention, a method is providing for joining two silicon pieces. The method includes the steps of sandwiching a single layer of aluminum between two silicon surfaces of two silicon pieces; and heating the sandwiched layer of aluminum and the two silicon surfaces to a temperature between a aluminum-silicon eutectic temperature and the melting point of silicon, and maintaining the sandwiched layer of material and the two surface between the aluminum-silicon eutectic temperature and the melting point of silicon until the aluminum and silicon diffuse into each other to produce a bond joint between the two pieces.

In one aspect, the bond joint includes an aluminum-silicon eutectic.

Other objects and advantages of the disclosed invention will become more apparent from a review of the specification, including the appended claims and drawings.

BRIEF DESCRIPTION OF THE DRAWINGS

FIG. 1 is a somewhat diagrammatic elevation view in partial section showing a heat pipe housing construction embodying the present invention;

FIG. 2 is an exploded perspective view showing the heat pipe construction of FIG. 1 prior to fabrication;

FIG. 3 is an enlarged, partial section view taken from line 3-3 in FIG. 1; and

FIG. 4 is a schematic representation of a method embodying the present invention.

DETAILED DESCRIPTION OF THE PREFERRED EMBODIMENTS

The invention is illustrated herein in connection with a flat heat pipe 10 that is utilized for cooling an electronic component 12 in the form of a chip 14 having a silicon housing casing or cap 16 with a silicon surface 18 at an interface with the heat pipe 10. This type of heat pipe is often referred to as a heat spreader. However, it should be understood that the invention can find use in other types of heat pipes, including heat pipes that are not flat, heat pipes that are used for cooling other types of electronic components, and heat pipes that are used for cooling items other than electronic components. Accordingly, the invention is not limited to the specific heat pipe 10 shown in the drawings, nor to use with electronic components, unless expressly stated in the claims. Furthermore, while the invention is described in connection with the bonding of silicon housing components for a heat pipe, the invention may find use in connection with the joining of other types of silicon components that are not used in connection with the housing of a heat pipe.

As seen in FIGS. 1 and 2, the heat pipe 10 includes a housing assembly 22 that is fabricated from two silicon housing pieces 24 and 26. The two housing pieces 24 and 26 define a working fluid chamber 28 that contains a suitable working fluid for the heat pipe. As is well known for heat pipes of this type, the heat from the electronic component 12 is transferred to the heat pipe 10 in the area overlying the electronic component 12 and then is transferred to the working fluid within the chamber 28. The working fluid in the area of the chamber 28 overlying the electronic component 12 vaporizes when it absorbs the heat from the electronic component 12 and then flows to the cooler regions of the chamber 28 that are remote from the electronic component 12. The heat is then rejected from the vaporized working fluid to the cooler portions of the heat pipe housing 22 which then rejects the heat to the environment surrounding the heat pipe 10. After rejecting its heat, the working fluid condenses and flows back to the area of the working chamber 28 that overlies the electronic components 12 and the cycle is repeated. In this regard, while not required, it may be desirable in some applications to provide some sort of wicking means to wick the liquified working fluid back to the area of the working chamber 28 overlying the electronic component 12. Any of the many well-known wicking devices can be employed, such as, for example, surface features provided on the surfaces of the interior chamber 28 or a separate wicking material that is contained within the working chamber 28.

In the illustrated embodiment, the housing piece 24 is a rectangular sheet of silicon having a pair of oppositely facing surfaces 30 and 32, with the surface 32 forming part of the interior chamber 28. The housing piece 26 is another rectangular sheet of silicon with a planar exterior surface 34 and an oppositely facing surface 36 having a rectangular relief 38 formed therein which defines the volume of the working chamber 28. The unrelieved portion of the surface 36 forms a peripheral flange 40 that surrounds the chamber 28 and interfaces with the surface 32 of the housing piece 24 at a bond joint 42 that surrounds and seals the chamber 28.

The bond joint 42 represents one difficulty associated with fabricating a heat pipe with silicon components, because for optimum performance of the heat pipe, the bond joint should preferably be strong, non-porous so as to maintain the initial atmosphere inside the heat pipe, and not reactive to the working fluid inside the heat pipe. To achieve at least some of these desired properties, the bond joint 42 is formed by a method that produces a bond by diffusion of silicon and a material that forms a eutectic with silicon, and preferably a bond that includes a eutectic zone or layer 43 of silicon and a material that forms a eutectic with silicon at the bond joint 42 which bonds the housings 24 and 26 together.

Preferably, the material 44 will be aluminum, an aluminum-silicon alloy, such as a 4047braze alloy with 12 percent silicon or a 4343 braze alloy with 7.5 percent silicon, or gold. In this regard, the aluminum-silicon binary eutectic temperature is 577.degree. Celsius and the gold-silicon eutectic temperature is 363.degree. Celsius, both of which are well below the 1410.degree. Celsius melting point of silicon. When heated to a temperature above the eutectic temperature for the material 44 and silicon, but below the melting points for the material 44 and silicon, the material 44 and silicon diffuse into each other forming a liquid melt that upon solidification creates the bond joint 42 which bonds the surfaces 32 and 36 of the pieces 24 and 26 together and which includes a eutectic of the silicon and material, such as a aluminum-silicon eutectic if aluminum is the material, or a gold-silicon eutectic if gold is the material. Indeed, it is possible, with good contact between the materials, that sufficient solid state diffusion of the material 44 and silicon can occur to form a suitable bond joint 42 even at temperatures below the eutectic temperature for the material 44 and silicon. It is highly preferred that a flux, and preferably a potassium fluoro aluminate flux, such as, for example, is sold under the trade name NOCOLOK.RTM., be used between the material 44 and the silicon regardless of whether heating above or below the eutectic temperature to form the bond joint 42. The flux removes oxidation layers between the material 44 and silicon and allows the desired diffusion.

The method includes the steps of providing a material 44, as seen in FIG. 2, that forms a eutectic with silicon at a temperature below the melting point of silicon, as shown at 50, in FIG. 4; sandwiching a layer of the material 44 between the two silicon surfaces 32 and 36 of the two pieces 24 and 26 of the heat pipe housing assembly 22, as shown at 52, in FIG. 4; and heating the sandwiched layer of the material 44 and the two silicon surfaces 32 and 36 to a temperature sufficient to create an adequate amount of diffusion between the material 44 and the silicon surfaces 32 and 36 to form a suitable bond joint 42, and preferably to a temperature between the eutectic temperature and the melting point of silicon; and maintaining the sandwiched layer of material 44 and the two surfaces 32 and 36 at the temperature (again, preferably between the eutectic temperature and the melting point of silicon) until the material 44 and the silicon diffuse into each other to produce an alloy that upon cooling and/or solidification forms the bond joint 42 that bonds the two pieces 24 and 26 together, as shown at 54, in FIG. 4, and which preferably includes the eutectic 43 of the material 44 and the silicon. Preferably, the heating and maintaining step shown at 54 is done in a dry nitrogen at one atmosphere. In some applications, it is also preferred that the heating and maintaining step shown at 54 be done at a temperature that is less than the liquidus point of the material 44 but, as previously stated, above the eutectic temperature for the material and silicon. It is also preferred that the sandwiched components 24, 26, and 44 be fixtured during the heating and maintaining step shown at 54 to prevent relative movement therebetween, to prevent gaps from forming in the bond joint 42, and to ensure an even distribution of the material 44 across the bond joint 42, as is typical for almost all types bonding operations.

As seen at 56, the method preferably includes the application of a flux 58 between the material 44 and each of the two silicon surfaces 32 and 36 prior to the sandwiching step 52. In a preferred embodiment, the flux 58 is a potassium fluoro aluminate flux as used in aluminum to aluminum brazing, a preferred type of which is sold under the trade name NOCOLOK®.

In one preferred embodiment, the material 44 is provided as a sheet of foil 59 that is sandwiched between the two surfaces 32 and 36. However, those skilled in the art will appreciate that there are many ways in which to form a layer of the material 44 between the two surfaces 32 and 36, any of which may be employed in the invention.

In one test of the proposed method, a pair of commercially available silicon wafer disks having a mirror like finish were bonded together with a layer of commercially available aluminum foil sandwiched therebetween, with an application of the previously described potassium fluoro aluminate flux 58 applied to the surfaces, but no other surface preparation or cleaning being performed. The sandwiched assembly was heated in dry nitrogen at about 645° Celsius for 13 minutes and produced a successful bond joint 42 with an aluminum-silicon eutectic at the joint 42. As another working example, a layer of aluminum 4047 braze alloy containing 12 percent silicon was sandwiched between the commercially available wafer disk after the previously described potassium fluoro aluminate flux 58 was applied to the surfaces and heated in dry nitrogen at one atmosphere at 645° Celsius for 25 minutes to successfully bond the two silicon disks together with an aluminum-silicon eutectic at the bond joint 42. In this regard, it should be noted that the components were held at the temperature for 25 minutes in an attempt to completely consume the layer of aluminum 4047 braze alloy, and it is believed that a suitable bond joint 42 would have formed at an even lower temperature and/or in less time at the temperature. As yet another working example, a layer of brazing paste sold by OMNI Technologies Corporation and which includes 4047 powder and NOCOLOK® flux held together in a paste form by a binder was sandwiched between the commercially available wafer disk and held at a temperature of about 607° Celsius for about 1.7 minutes in one sample and 3.3 minutes in another sample with both resulting in a successful bond joint 42.

It should be appreciated that the period of time for the step 54 will be dependent upon a number of factors specific to each application, including, the particular material 44 chosen, the amount of the material 44 used for the layer, the temperature (s) at which the heating and maintaining step is performed, and the amount of diffusion of the material 44 and the silicon desired to form the bond.

It should be appreciated that the housing assembly 22 and the silicon housing pieces 24 and 26 can take many forms, and that the housing assembly 22 to be made for more than two silicon housing pieces 24 and 26 having peripheral bond joints between each of the pieces. Additionally, in one embodiment, one of the housing pieces 24 and 26 is utilized as the cap or lid for the electronic component 12, replacing the standard lid or cap for the component 12.

In one preferred embodiment, the amount of the material 44 provided for the layer is adjusted so that during the heating and maintaining step shown at 54 essentially all of the material 44 diffuses with the silicon to form a eutectic of the material and silicon at the bond joint 42 with little or none of the material 44 remaining in its original form at the bond joint 42 and at least some of the material, but most likely not all of the material, forming a eutectic with the silicon. In other preferred embodiments, all of the material 44 does not diffuse with the silicon and accordingly results in a bond joint 42 that has two eutectic zones or layers 43, one each on either side of the material 44 sandwiched between the two silicon surfaces 32 and 36.

It will be appreciated that by making the housing pieces 24 and 26 from silicon, a bond joint 42 can be formed between the heat pipe 10 and the silicon housing/casing 16 of the chip that undergoes little or no thermal induced stresses caused by differences in thermal expansion of dissimilar materials, as is common in conventional heat pipes. This is advantageous in that it can potentially enhance both the performance and service life of the heat pipe 10 and the electronic component 12 and allow for a broader range of bonding techniques and materials to be used between the heat pipe 10 and electronic component 12.

While the disclosure has been focused on the fabrication of a heat pipe housing made of silicon, it should be appreciated that the disclosed method of bonding two silicon pieces together using a single layer of a material 44 (such as of aluminum or aluminum-silicon alloy) that forms a eutectic with silicon, with the optional but preferred use of a flux material which is preferably a potassium fluoro aluminum flux, may find use in the joining of silicon components other than those used to form a heat pipe housing.

The invention claimed is:

1. A method of fabricating a heat pipe housing made of silicon, the method comprising the steps of:
   providing a material that forms a eutectic with silicon at a temperature below the melting point of silicon;
   sandwiching a layer of the material between two silicon surfaces of two pieces of a heat pipe housing; and
   heating the sandwiched layer of the material and the two silicon surfaces to a temperature between a eutectic temperature of the material and silicon, and the melting point of silicon, and maintaining the sandwiched layer of material and the two silicon surfaces between the eutectic temperature and the melting point of silicon until the material and the silicon diffuse into each other to produce a bond joint between the two pieces.

2. The method of claim 1 wherein the heating step comprises heating the sandwiched layer of the material and the two silicon surfaces in dry nitrogen at 1 atmosphere to a temperature between the eutectic temperature and the melting point of silicon, and maintaining the sandwiched layer of material and the two silicon surfaces between the eutectic temperature and the melting point of silicon in dry nitrogen at 1 atmosphere until the material and the silicon diffuse into each other to produce an alloy including a eutectic of the material and the silicon upon solidification.

3. The method of claim 1 wherein the material comprises aluminum.

4. The method of claim 1 wherein the material comprises gold.

5. The method of claim 1 wherein the sandwiching step comprises sandwiching a foil of the material between the two silicon surfaces.

6. The method of claim 1 further comprising the step of applying a flux between the layer and each of the two silicon surfaces prior to the sandwiching step.

7. The method of claim 6 wherein the step of applying a flux comprises applying potassium fluoro aluminate flux between the layer and each of the two silicon surfaces prior to the sandwiching step.

8. The method of claim 1 wherein the heating and maintaining step is performed at temperatures that are less than the liquidus point of the material.

9. The method of claim 1 wherein the heating step produces the bond joint to include a eutectic of the material and the silicon.

10. A method of fabricating a heat pipe housing made of silicon, the method comprising the steps of:
    sandwiching a layer of aluminum or aluminum-silicon alloy between two silicon surfaces of two pieces of a heat pipe housing;
    heating the sandwiched layer of aluminum and the two silicon surfaces to a temperature between an aluminum-silicon eutectic temperature and the melting point of silicon, and maintaining the sandwiched layer of material and the two silicon surfaces between the aluminum-silicon eutectic temperature and the melting point of silicon until the aluminum and the silicon diffuse into each other to produce a bond joint between the two pieces.

11. The method of claim 10 wherein the heating step comprises heating the sandwiched layer of aluminum and the two silicon surfaces in dry nitrogen at 1 atmosphere to a temperature between the aluminum-silicon eutectic temperature and the melting point of silicon, and maintaining the sandwiched layer of material and the two silicon surfaces between the aluminum-silicon eutectic temperature and the melting point of silicon in dry nitrogen at 1 atmosphere until the aluminum and the silicon diffuse into each other to produce an alloy including an aluminum-silicon eutectic upon solidification.

12. The method of claim 10 wherein the sandwiching step comprises sandwiching a foil of aluminum between the two silicon surfaces.

13. The method of claim 10 further comprising applying a flux between the layer and each of the two silicon surfaces prior to the sandwiching step.

14. The method of claim 10 wherein the step of applying a flux comprises applying potassium fluoro aluminate flux between the layer and each of the two silicon surfaces prior to the sandwiching step.

15. The method of claim 10 wherein the heating and maintaining step is performed at temperatures less than the liquidus point of aluminum.

16. The method of claim 10 wherein the heating step produces the bond joint to include an aluminum-silicon eutectic.

17. A method of fabricating a heat pipe housing made of silicon, the method comprising the steps of:
    sandwiching a layer of gold between two silicon surfaces of two pieces of a heat pipe housing;
    heating the sandwiched layer of gold and the two silicon surfaces to a temperature between a gold-silicon eutectic temperature and the melting point of silicon, and maintaining the sandwiched layer of material and the two silicon surfaces between the gold-silicon eutectic temperature and the melting point of silicon until the gold and the silicon diffuse into each other to produce a bond joint between the two pieces.

18. The method of claim 17 wherein the sandwiching step comprises sandwiching a foil of gold between the two silicon surfaces.

19. The method of claim 17 further comprising applying a flux between the layer and each of the two silicon surfaces prior to the sandwiching step.

20. The method of claim 17 wherein the heating and maintaining step is performed at temperatures below the liquidus point of gold.

21. The method of claim 17 wherein the heating and maintaining step is performed at temperatures below the liquidus point of gold.

22. The method of claim 17 wherein said heating step produces the bond joint to include a gold-silicon eutectic.

23. A method of bonding a pair of silicon components, the method comprising the steps of:
    providing a material that forms a eutectic with silicon at a temperature below the melting point of silicon;
    sandwiching a layer of the material between two silicon surfaces of two silicon components, with a potassium fluoro aluminate flux between the layer and each of the two silicon surfaces; and
    heating the sandwiched layer of the material and the two silicon surfaces to a suitable elevated temperature for a sufficient amount of time to allow the material and the silicon to diffuse into each other to produce a bond joint between the two silicon components.

24. The method of claim 23 wherein the heating step comprises heating the sandwiched layer of the material and the two silicon surfaces in dry nitrogen at 1 atmosphere to a temperature between the eutectic temperature and the melting point of silicon, and maintaining the sandwiched layer of material and the two silicon surfaces between the eutectic temperature and the melting point of silicon in dry nitrogen at 1 atmosphere until the material and the silicon diffuse into each other to produce an alloy including a eutectic of the material and the silicon upon solidification.

25. The method of claim 23 wherein the material comprises aluminum.

26. The method of claim 23 wherein the material comprises gold.

27. The method of claim 23 wherein the sandwiching step comprises sandwiching a foil of the material between the two silicon surfaces.

28. The method of claim 23 wherein the heating and maintaining step is performed at temperatures that are less than the liquidus point of the material.

29. The method of claim 17 wherein the heating step produces a bond joint that includes a eutectic of the material and the silicon.

* * * * *